(12) United States Patent
Ryu et al.

(10) Patent No.: US 12,095,048 B2
(45) Date of Patent: Sep. 17, 2024

(54) APPARATUS OF TESTING ALL-SOLID STATE SECONDARY BATTERY BY NAIL PENETRATION

(71) Applicant: SK On Co., Ltd., Seoul (KR)

(72) Inventors: Jaechan Ryu, Daejeon (KR); Cholho Lee, Daejeon (KR)

(73) Assignee: SK ON CO., LTD., Seoul (KR)

( * ) Notice: Subject to any disclaimer, the term of this patent is extended or adjusted under 35 U.S.C. 154(b) by 111 days.

(21) Appl. No.: 17/974,742

(22) Filed: Oct. 27, 2022

(65) Prior Publication Data

US 2023/0133663 A1 May 4, 2023

(30) Foreign Application Priority Data

Oct. 28, 2021 (KR) .................... 10-2021-0145888

(51) Int. Cl.
*H01M 10/42* (2006.01)
*G01R 31/36* (2020.01)
*G01R 31/3835* (2019.01)

(52) U.S. Cl.
CPC .... *H01M 10/4285* (2013.01); *G01R 31/3646* (2019.01); *G01R 31/3835* (2019.01)

(58) Field of Classification Search
CPC .................... H01M 10/4285; G01R 31/3646
See application file for complete search history.

(56) References Cited

FOREIGN PATENT DOCUMENTS

| KR | 20100118189 A | * | 11/2010 |
| KR | 10-2016-0009283 A | | 1/2016 |
| KR | 20190056984 A | * | 5/2019 |
| KR | 10-1983849 B1 | | 9/2019 |
| KR | 20190142513 A | * | 12/2019 |
| KR | 10-2106451 B1 | | 5/2020 |

* cited by examiner

*Primary Examiner* — Minh Q Phan
(74) *Attorney, Agent, or Firm* — IP & T GROUP LLP (57) ABSTRACT

An apparatus of testing an all-solid state secondary battery by nail penetration includes a pressurizing unit pressurizing a battery cell, a penetrating member inserted into a through-hole provided in the pressurizing unit to pass through the battery cell, and an auxiliary pressing unit disposed between the pressurizing unit and the battery cell and transferring pressure applied by the pressurizing unit to the battery cell. The auxiliary pressing unit is disposed between the through-hole and the battery cell in a form to block the through-hole.

14 Claims, 7 Drawing Sheets

APPARATUS OF TESTING ALL-SOLID STATE SECONDARY BATTERY BY NAIL PENETRATION

CROSS-REFERENCE TO RELATED APPLICATION(S)

This application claims benefit of priority to Korean Patent Application No. 10-2021-0145888 filed on Oct. 28, 2021 in the Korean Intellectual Property Office, the disclosure of which is incorporated herein by reference in its entirety.

BACKGROUND

1. Field

The present disclosure relates to an apparatus of testing an all-solid-state secondary battery by nail penetration.

2. Description of Related Art

Recently, with the rapid development of industries such as electronics and communication, high-output batteries have been widely used. Since most currently commercialized lithium secondary batteries use an organic liquid electrolyte in which lithium salt is dissolved in a flammable organic solvent, there is a potential risk of fire and explosion, including leakage.

Accordingly, development of an all-solid-state battery using a solid electrolyte instead of a liquid electrolyte is in progress. Since the all-solid-state battery does not contain a flammable organic solvent, there is an advantage that the safety device may be simplified, and research and development are being carried out in various aspects.

As all-solid-state batteries are developed as described above, a test device for measuring the state of the all-solid-state battery is also required. However, since most related art battery cell test devices are test devices for lithium secondary batteries using a liquid electrolyte, there is a need for a test apparatus optimized for all-solid-state battery cells.

SUMMARY

An aspect of the present disclosure is to provide a battery cell penetration test apparatus suitable for testing all-solid battery cells.

According to an aspect of the present disclosure, an apparatus of testing an all-solid state secondary battery by nail penetration includes a pressurizing unit pressurizing a battery cell, a penetrating member inserted into a through-hole provided in the pressurizing unit to pass through the battery cell, and an auxiliary pressing unit disposed between the pressurizing unit and the battery cell and transferring pressure applied by the pressurizing unit to the battery cell. The auxiliary pressing unit is disposed between the through-hole and the battery cell in a form to block the through-hole.

The auxiliary pressing unit may be disposed to face an entirety of one surface of the battery cell.

The auxiliary pressing unit may be formed of an insulating resin material.

The auxiliary pressing unit may be formed of a thermoplastic resin or a thermosetting resin.

The pressurizing unit may include a first pressing portion disposed on the battery cell and pressing the battery cell while descending, and a second pressing portion disposed below the battery cell and supporting the battery cell.

The apparatus of testing an all-solid state secondary battery by nail penetration may further include a fastening member coupled to the first pressing portion and the second pressing portion to adjust a separation distance between the first and second pressing portions.

The pressurizing unit may be provided with at least one temperature sensor disposed on a pressing surface in contact with the auxiliary pressing unit.

The apparatus of testing an all-solid state secondary battery by nail penetration may further include a temperature measurement unit connected to the temperature sensor to measure a temperature of the battery cell.

The pressurizing unit may be provided with at least one pressure sensor disposed on a pressing surface in contact with the auxiliary pressing unit.

The apparatus of testing an all-solid state secondary battery by nail penetration may further include a voltage measurement unit connected to an electrode lead of the battery cell to measure a voltage change of the battery cell.

The apparatus of testing an all-solid state secondary battery by nail penetration may further include a controller obtaining voltage change information and temperature change information of the battery cell and outputting the information to a display.

The auxiliary pressing unit may be inserted and disposed in the through-hole.

The through-hole may be provided with an expansion groove in which the auxiliary pressing unit is disposed.

A pressing surface of the pressurizing unit and a pressing surface of the auxiliary pressing unit may be disposed on the same plane.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Prior to the detailed description of the present disclosure, the terms or words used in the present specification and claims described below should not be construed as being limited to conventional or dictionary meanings. Based on the principle that the inventor may appropriately define the concept of a term in order to describe the present disclosure in the best manner he or she knows how, it should be interpreted as a meaning and concept consistent with the technical idea of the present disclosure. Therefore, the configuration illustrated in the embodiments and drawings described in this specification is only the exemplary embodiment, and since it does not represent all technical ideas of the present disclosure, it should be understood that various equivalents and modifications may be substituted therefor.

Hereinafter, embodiments of the present disclosure will be described in detail with reference to the accompanying drawings. In this case, it should be noted that the same components in the accompanying drawings are denoted by the same reference numerals as much as possible. In addition, detailed descriptions of well-known functions and configurations that may obscure the gist of the present disclosure will be omitted. For the same reason, some components are exaggerated, omitted, or schematically illustrated in the accompanying drawings, and the size of each component does not fully reflect the actual size.

The all-solid-state battery cell may be an all-solid-state battery using a solid electrolyte instead of an electrolyte containing a combustible organic solvent. Accordingly, the all-solid-state battery may greatly reduce the possibility of a fire or explosion even if a short circuit occurs compared to a lithium ion battery using an electrolyte, and safety may be increased. However, due to the low contact force and high interfacial resistance between the solid electrolyte and the electrode in the all-solid-state battery, pressurization is essential when the battery cell is driven, and accordingly, there is a need for a device that may evaluate the safety when penetrating through the cell in a pressurized state.

Hereinafter, an apparatus of testing an all-solid state secondary battery by nail penetration, capable of evaluating stability when penetrating a cell in a pressurized state according to an embodiment will be described.

Figure 1:
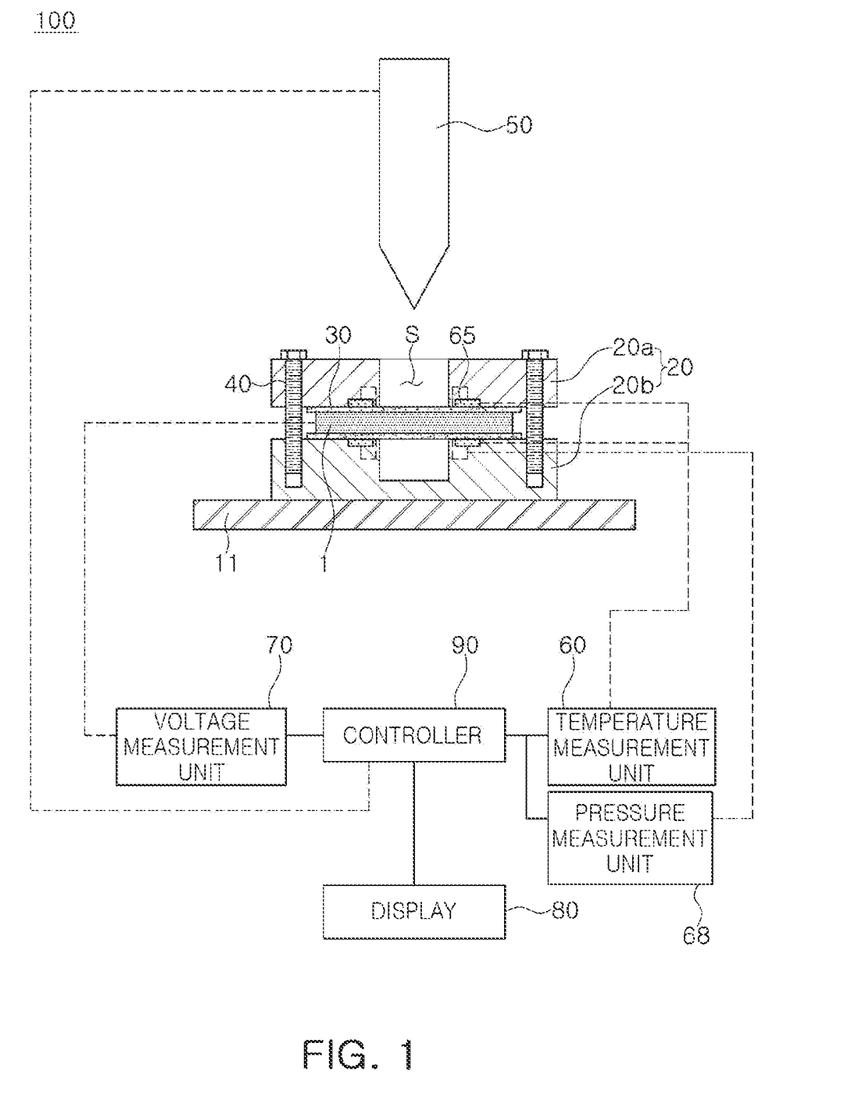
FIG. 1 is a cross-sectional view schematically illustrating an apparatus of testing an all-solid-state secondary battery by nail penetration according to an embodiment.
Figure 2:
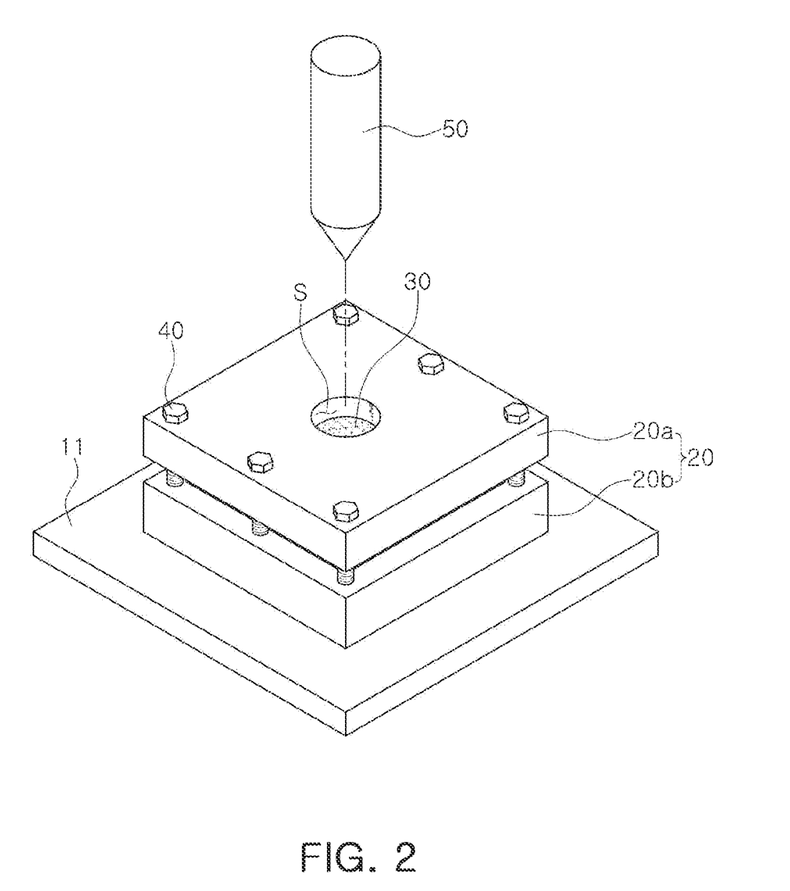
FIG. 2 is a perspective view of the apparatus of testing an all-solid-state secondary battery by nail penetration illustrated in FIG. 1.
Figure 3:
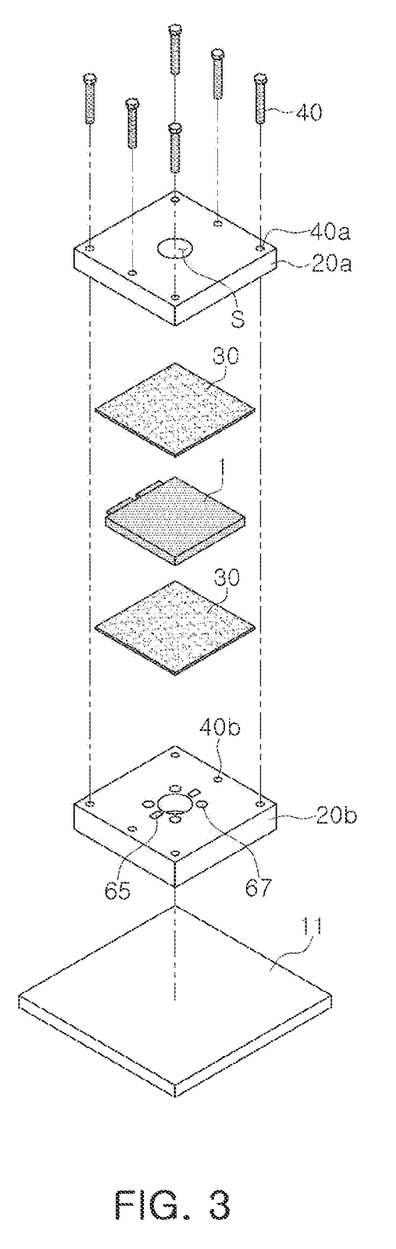
FIG. 3 is an exploded perspective view of FIG. 2.
Figure 4:
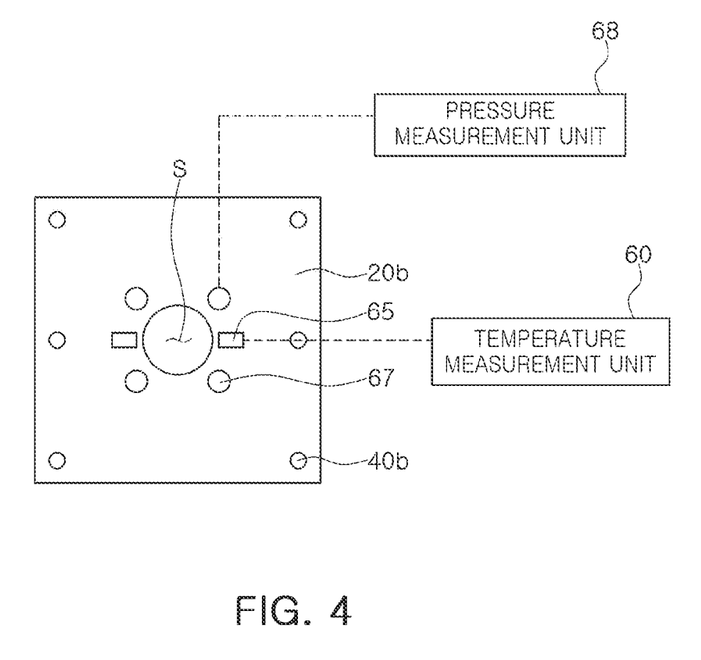
FIG. 4 is a plan view of a second pressing portion illustrated in FIG. 3.

FIG. 1 is a cross-sectional view schematically illustrating an apparatus of testing an all-solid-state secondary battery by nail penetration according to an embodiment, and FIG. 2 is a perspective view of the apparatus of testing an all-solid-state secondary battery by nail penetration illustrated in FIG. 1. Also, FIG. 3 is an exploded perspective view of FIG. 2, and FIG. 4 is a plan view of a second pressing portion illustrated in FIG. 3. In this case, FIGS. 2 to 3 omit the controller, the voltage measurement unit, the temperature measurement unit, and the display for convenience of descriptions.

Referring to FIGS. 1 to 4, an apparatus 100 of testing an all-solid-state secondary battery by nail penetration according to an embodiment may be a device for performing a penetration test while applying pressure to a battery cell 1, and may include a pressurizing unit 20, a penetrating member 50, and an auxiliary pressing unit 30.

The penetration test is a test to check whether the battery cell 1 has exploded, a change in current value, and a change in temperature of the battery cell 1 after penetrating through the battery cell 1 with the pointed penetrating member 50.

Accordingly, the apparatus 100 of testing an all-solid-state secondary battery by nail penetration according to the present embodiment may include the penetrating member 50 penetrating through the battery cell 1. The penetrating member 50 may be formed in the form of a nail or a pin, and may be configured to be driven up and down by a lifting member (not illustrated).

The pressurizing unit 20 may pressurize and fix the battery cell 1. To this end, the pressurizing unit 20 may include a first pressing portion 20a and a second pressing portion 20b.

The first pressing portion 20a may be disposed on the upper portion of the battery cell 1 and pressurize the battery cell 1 while descending. In addition, the second pressing portion 20b may be disposed below the battery cell 1 to support the battery cell 1.

Each of the first and second pressing portions 20a and 20b may be formed of a plate-shaped member or a block-shaped member having rigidity that does not bend during the penetration test process.

The first and second pressing portions 20a and 20b may be stacked in parallel to each other and spaced apart from each other by a predetermined distance so as not to contact each other. In addition, the battery cell 1 to be measured may be interposed between the first and second pressing portions 20a and 20b.

In this embodiment, the second pressing portion 20b may be fixed on a base 11 having a flat shape. Accordingly, the pressurizing unit 20 may be stably supported by the base 11. However, the configuration of the present disclosure is not limited thereto, and as long as the second pressing portion 20b may be stably fixed, the base 11 may be omitted.

The first pressing portion 20a may be disposed above the battery cell 1 to press the battery cell 1 downwardly. The second pressing portion 20b may be disposed below the battery cell 1 to support the battery cell 1.

The first pressing portion 20a may be formed to have the area larger than the area of the battery cell 1, and may be provided with a fastening hole 40a forming along an edge, into which a fastening member 40 such as a bolt or the like is inserted.

The second pressing portion 20b may include a fastening groove 40b to which the fastening member 40 is coupled. A thread may be formed in the fastening groove 40b for coupling with the fastening member 40.

The fastening member 40 may fix and fasten the first pressing portion 20a and the second pressing portion 20b to each other. Therefore, one end (e.g., bolt head) of the fastening member 40 may be disposed outside the first pressing portion 20a, and the other end thereof passes through the fastening hole 40a to be screwed into the fastening groove 40b of the second pressing portion 20b.

The fastening member 40 may define a separation distance between the first pressing portion 20a and the second pressing portion 20b. For example, the separation distance between the first pressing portion 20a and the second pressing portion 20b may be fixed or adjusted by the fastening member 40.

The apparatus 100 of testing an all-solid-state secondary battery by nail penetration according to this embodiment may adjust the distance between the first pressing portion 20a and the second pressing portion 20b using the fastening member 40, and thus, the battery cell 1 may be pressurized.

When the fastening member 40 is formed of a bolt, by rotating the bolt, the distance between the first pressing portion 20a and the second pressing portion 20b may be adjusted. For example, by rotating the head of the bolt protruding upwardly of the first pressing portion 20a, the first pressing portion 20a is moved toward the second pressing portion 20b, and accordingly, the battery cell 1 may be pressurized by the first pressing portion 20a.

At this time, to pressurize the entire battery cell 1 with a uniform pressure, the plurality of fastening members 40 may be rotated together. Therefore, although not illustrated, a unit that is coupled to the plurality of fastening members 40 to simultaneously rotate the plurality of fastening members 40 at the same rotational speed may be provided.

In addition, the pressurizing unit 20 of the present embodiment may be provided with at least one temperature sensor 65.

The temperature sensor 65 may be provided on a surface (hereinafter, pressurized surface) facing the battery cell 1 among the first and second pressing portions 20a and 20b, and one or a plurality of temperature sensors may be dispersedly disposed in an area facing the battery cell 1.

Referring to FIG. 4, in the present embodiment, two temperature sensors 65 are disposed on the second pressing portion 20b and spaced apart from each other by a predetermined distance, around a through-hole S. Also, referring to FIG. 1, two temperature sensors 65 are also disposed on the first pressing portion 20a, around the through-hole S. As such, in the pressurizing unit 20 of this embodiment, the temperature sensors 65 may be disposed on the pressing surface of the first pressing portion 20a and the pressing surface of the second pressing portion 20b, respectively.

However, the configuration of the present disclosure is not limited thereto, and the number or position of the temperature sensors 65 may be variously changed according to the size or shape of the battery cell 1.

For accurate temperature measurement, the sensing surface of the temperature sensor 65 may be disposed on the same plane as the pressing surface of the pressurizing unit 20. Accordingly, the sensing surface of the temperature sensor 65 may be exposed in a region of the pressing surfaces, facing the battery cell 1.

The temperature sensor 65 may be electrically connected to a temperature measurement unit 60 to be described later and may transmit the measured temperature to the temperature measurement unit 60.

At least a portion of the temperature sensor 65 of the present embodiment may be inserted and disposed in the pressurizing unit 20 to be firmly fixedly coupled to the pressurizing unit 20. Therefore, the temperature sensor 65 may be prevented from shaking or being separated from the battery cell 1 in the process of the battery cell 1 being exploded, and therefore, stable and reliable temperature measurement may be performed.

In addition, the pressurizing unit 20 of the present embodiment may include at least one pressure sensor 67.

The pressure sensor 67 may be provided on the pressing surface of the pressurizing unit 20, and one or a plurality of pressure sensors may be dispersedly disposed in an area facing the battery cell 1.

Referring to FIG. 4, in the present embodiment, four pressure sensors 67 are disposed on the second pressing portion 20b at a predetermined distance around the through-hole S. However, the configuration of the present disclosure is not limited thereto, and the number or position of the pressure sensors 67 may be variously changed according to the size or shape of the battery cell 1.

For accurate pressure measurement, the sensing surface of the pressure sensor 67 may be disposed on the same plane as the pressing surface of the pressurizing unit 20.

The pressure sensor 67 may be electrically connected to a pressure measurement unit 68 to transmit the measured pressure to the pressure measurement unit 68.

In addition, the first and second pressing portions 20a and 20b of the present embodiment may have the through-hole S into which the penetrating member 50 is inserted. The through-hole S may be used as a space into which the penetrating member 50 is inserted and moved to penetrate through the battery cell 1 during the penetrating test. Therefore, the inner diameter of the through-hole (S) may be formed to be greater than the diameter of the through member 50.

On the other hand, as described above, as the battery cell 1 of the present embodiment, an all-solid-state battery cell having higher safety than a lithium ion battery cell may be used. Therefore, the penetrating member 50 penetrating through the battery cell 1 may also have a greater diameter than a diameter of a battery cell of the related art having an electrolyte. Accordingly, the through-hole (S) may also be formed greater than in the related art.

For example, the through-hole S of the present embodiment may be formed in a size having a diameter of 10 to 15 mm.

When the through-hole (S) is formed relatively large as described above, since a portion of the battery cell 1 disposed in a position corresponding to the through-hole S is not normally pressurized by the first and second pressing portions 20a and 20b, a deviation may occur in the pressure applied to the battery cell 1. In this case, there may be a problem in that the penetration test is performed in a state in which the actual usage conditions of the battery cell 1 are not properly reflected.

To this end, the apparatus 100 of testing an all-solid-state secondary battery by nail penetration according to the present embodiment may include an auxiliary pressing unit 30.

The auxiliary pressing unit 30 may be disposed in at least one of between the first pressing portion 20a and the battery cell 1 and between the second pressing portion 20b and the battery cell 1, and may transfer the pressure applied by the pressurizing unit 20 to the battery cell 1.

The auxiliary pressing unit 30 may be formed with a larger area than the area of the battery cell 1, and accordingly, the battery cell 1 may be disposed such that the entirety of one surface faces the auxiliary pressing unit 30. Accordingly, the auxiliary pressing unit 30 may be disposed between the through-hole S and the battery cell 1 in the form of blocking the through-hole S of the pressurizing unit 20.

The auxiliary pressing unit 30 may be formed of a flat plate, and may be formed of a material having a certain level of strength.

As described above, the auxiliary pressing unit 30 may be provided to pressurize a portion of the battery cell 1 that is disposed on a position corresponding to the through-hole S. Thus, even when the through-hole (S) is formed in the pressurizing unit 20, since the entirety of the battery cell 1 may be pressurized with a uniform pressure, the pressure deviation applied to the battery cell 1 may be significantly reduced.

As a material of the auxiliary pressing unit 30, as long as the first and second pressing portions 20a and 20b are not easily damaged in the process of pressing the battery cell 1, and the portion corresponding to the through-hole S is not easily deformed, a variety of materials may be used.

In this embodiment, the auxiliary pressing unit 30 may be formed in the form of a flat plate or film, and may be formed of an insulating material such as resin. For example, the auxiliary pressing unit 30 may be formed of a thermoplastic resin or a thermosetting resin, in detail, may be formed of a material such as acrylic resin, polyvinyl chloride, polycarbonate, or the like, but the present disclosure is not limited thereto.

For example, when the auxiliary pressing unit 30 is formed of an insulating resin material, the auxiliary pressing unit 30 may be formed to have a thickness of 0.1 mm to 0.5 mm. However, the configuration of the present disclosure is not limited thereto, and as long as the part facing the through-hole S may be pressed when pressurizing the battery cell 1, the auxiliary pressing unit 30 may be formed in various thicknesses.

The auxiliary pressing unit 30 of this embodiment is disposed between the pressurizing unit 20 and the battery cell 1 in the form of blocking the entire through-hole (S), and when the penetrating member 50 penetrates through the battery cell 1, the auxiliary pressing unit may be penetrated or damaged by the penetrating member 50.

Therefore, the auxiliary pressing unit 30 may be provided as a plurality of auxiliary pressing units 30, and when the auxiliary pressing unit 30 mounted in the apparatus 100 of testing an all-solid-state secondary battery by nail penetration is damaged or penetrated during the penetration test process, the operator may perform a new penetration test by replacing the damaged auxiliary pressing unit 30 with another new auxiliary pressing unit 30.

The temperature measurement unit 60 may be electrically connected to the temperature sensor 65 to measure the temperature of the battery cell 1 in a penetration test process. The temperature change information measured by the temperature measurement unit 60 may be provided to a controller 90.

The pressure measurement unit 68 may be electrically connected to the pressure sensor 65 to measure the pressure applied to the battery cell 1 during the penetration test process. The pressure change information measured by the pressure measurement unit 68 may be provided to the controller 90.

A voltage measurement unit 70 is electrically connected to an electrode lead of the battery cell 1 and may measure a voltage change of the battery cell 1. For example, when the penetrating member 50 passes through the battery cell 1, the voltage measurement unit 70 may repeatedly measure the short-circuit voltage of the battery cell 1 at time intervals. The voltage change information measured by the voltage measurement unit 70 may be provided to the controller 90.

The controller 90 may control the pressure applied to the battery cell 1 based on the pressure change information transmitted by the pressure measurement unit 68.

In detail, the controller 90 controls the rotation of the fastening member 40 to adjust the distance between the first pressing portion 20a and the second pressing portion 20b, and accordingly, may control the pressure applied to the battery cell 1. In addition, the controller 90 may control the position and the elevation of the penetrating member 50 by controlling an elevation unit.

In addition, based on the temperature change information and voltage change information transmitted from the temperature measurement unit 60 and the voltage measurement unit 70, the controller 90 may determine the short-circuit current that causes the short-circuit voltage to be formed based on the equivalent circuit provided by modeling the all-solid-state battery cell 1, store the aspect of temporal changes in the value for the determined short-circuit current, or may visually output the same through a display 80.

Next, the operation of the apparatus 100 of testing an all-solid-state secondary battery by nail penetration according to the present embodiment will be described.

Figure 5:
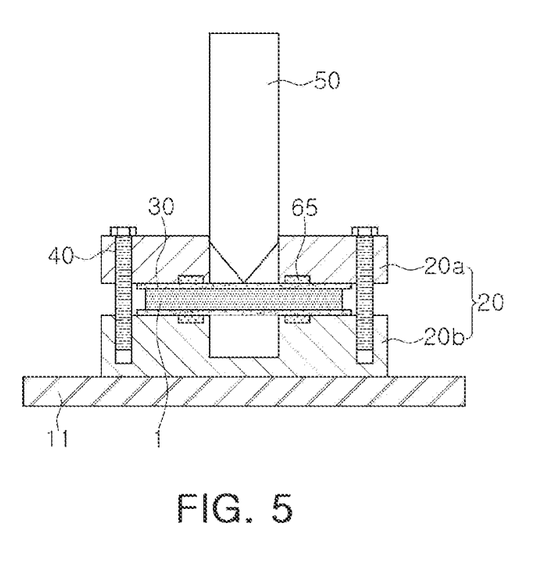
FIGS. 5 to 7 are views illustrating the operation of the apparatus of testing an all-solid-state secondary battery by nail penetration illustrated in FIG. 1.
Figure 6:
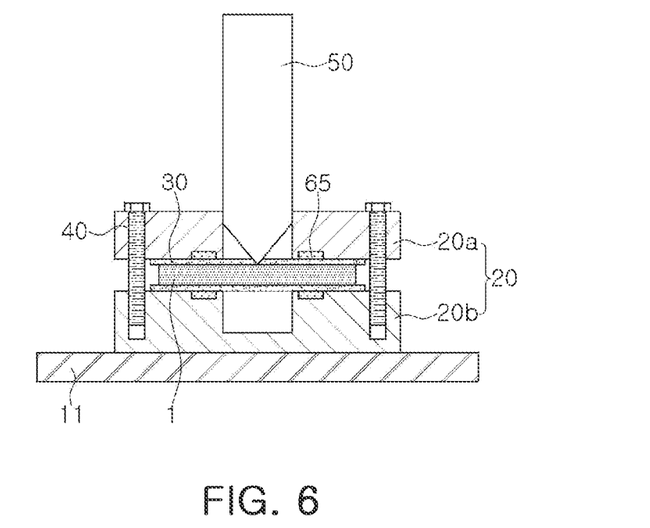
Figure 7:
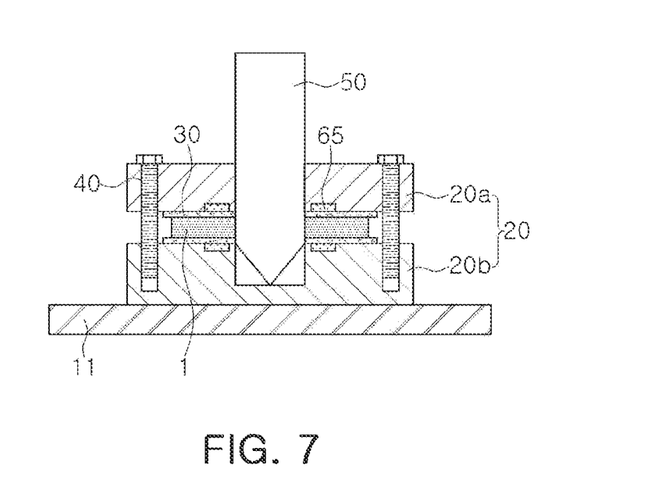

FIGS. 5 to 7 are views illustrating the operation of the apparatus of testing an all-solid-state secondary battery by nail penetration illustrated in FIG. 1.

First, as illustrated in FIG. 1, after the battery cell 1 is disposed between the second pressing portion 20b and the first pressing portion 20a; by adjusting the separation distance between the first pressing portion 20a and the second pressing portion 20b using the fastening member 40, the battery cell 1 is pressurized to a preset pressure.

In this process, the auxiliary pressing unit 30 may be disposed between the first pressing portion 20a and the battery cell 1 and between the second pressing portion 20b and the battery cell 1, respectively. Accordingly, the battery cell 1 is disposed such that all or most of both surfaces are in surface contact with the auxiliary pressing unit 30, respectively. In addition, a portion of the battery cell 1 facing the through-hole S is also pressed with the same pressure as the other parts by the auxiliary pressing unit 30.

Then, as illustrated in FIG. 5, the controller 90 lowers the penetrating member 50 and inserts the penetrating member 50 into the through-hole S. Accordingly, as illustrated in FIG. 6, the penetrating member 50 comes into contact with the auxiliary pressing unit 30 disposed between the first pressing portion 20a and the battery cell 1.

Then, when the controller 90 continues to lower the penetrating member 50, the penetrating member 50 penetrates or breaks the auxiliary pressing unit 30, and then penetrates through the battery cell 1 as illustrated in FIG. 7. In this case, the penetrating member 50 having passed through the battery cell 1 may also penetrate through the auxiliary pressing unit 30 disposed between the battery cell 1 and the second pressing portion 20b, and may be inserted into the through-hole S of the second pressing portion 20b.

Thereafter, the voltage measurement unit 70 repeatedly measures the short-circuit voltage of the battery cell 1 at time intervals, and the temperature measurement unit 60 may continuously measure the temperature change of the battery cell 1.

Also, the controller 90 may output information transmitted from the temperature measurement unit 60 and the voltage measurement unit 70 to the display 80. Further, the controller may determine the short-circuit current forming the short-circuit voltage based on the equivalent circuit modeling the all-solid-state battery cell 1, and store the aspect of temporal changes in the determined short-circuit current value, or may visually output the same through the display 80.

In the apparatus 100 of testing an all-solid-state secondary battery by nail penetration according to the present embodiment configured as described above, the entire battery cell 1 may be uniformly pressurized even when the through-hole S is formed in the pressurizing unit 20. Accordingly, the occurrence of an error in measurement due to a deviation in the pressure applied to the battery cell 1 may be significantly reduced.

In addition, since the temperature sensor 65 is integrally disposed in the pressurizing unit 20, the temperature sensor 65 may be prevented from shaking or being separated from the battery cell 1 in the process of the battery cell 1 being exploded. Accordingly, more stable measurement may be performed, and the reliability of the measurement may be increased.

On the other hand, the present disclosure is not limited to the above-described embodiment and various modifications are possible.

Figure 8:
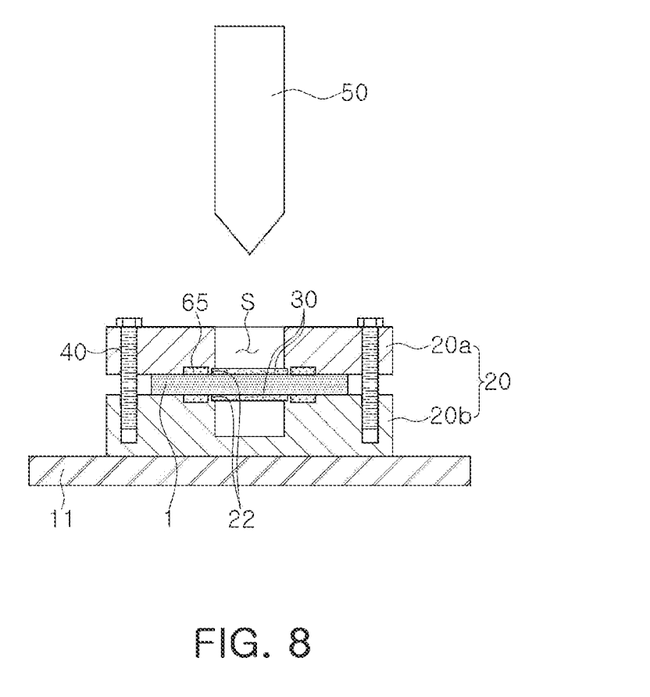
FIG. 8 is a cross-sectional view schematically illustrating an apparatus of testing an all-solid-state secondary battery by nail penetration according to another embodiment.
Figure 9:
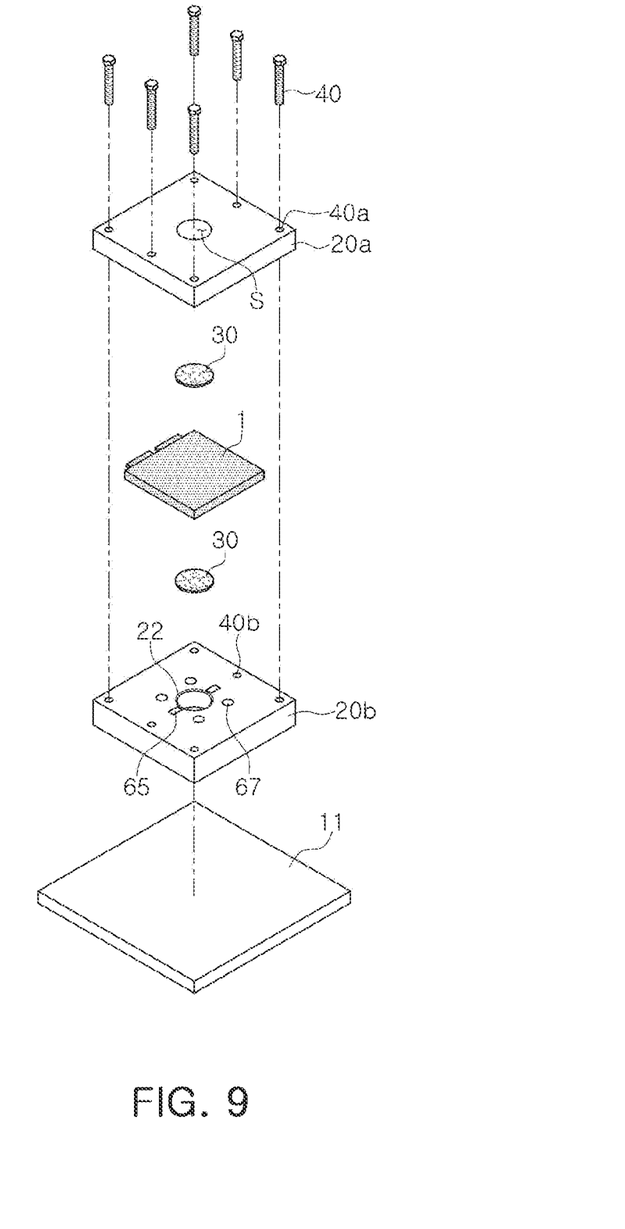
FIG. 9 is an exploded perspective view of the apparatus of testing an all-solid-state secondary battery by nail penetration illustrated in FIG. 8.

FIG. 8 is a cross-sectional view schematically illustrating an apparatus of testing an all-solid-state secondary battery by nail penetration according to another embodiment, and FIG. 9 is an exploded perspective view of the apparatus of testing an all-solid-state secondary battery by nail penetration illustrated in FIG. 8, for convenience of descriptions, by omitting the controller, the voltage measurement unit, the temperature measurement unit, the pressure measurement unit, and the display from the illustration.

Referring to FIGS. 8 and 9, in the apparatus 100 of testing an all-solid-state secondary battery by nail penetration according to the present embodiment, the auxiliary pressing unit 30 may be inserted and disposed in the through-hole S of the pressurizing unit 20.

To this end, the through-hole S of the pressurizing unit 20 may include an expansion groove 22 in which the auxiliary pressing unit 30 is disposed. The expansion groove 22 may be formed in a shape to expand the diameter of the through-hole S, and may be formed on the pressing surface of the pressurizing unit 20.

The thickness of the expansion groove 22 may be the same as the thickness of the auxiliary pressing unit 30, and the auxiliary pressing unit 30 may be formed to be the same as that of the expansion groove 22. For example, the auxiliary pressing unit 30 may be formed in a disk shape.

Accordingly, the entirety of the auxiliary pressing unit 30 of the present embodiment may be inserted and disposed in the expansion groove 22. Also, the pressing surface of the pressurizing unit 20 and the pressing surface of the auxiliary pressing unit 30 may be disposed on the same plane.

In the apparatus of testing an all-solid-state secondary battery by nail penetration according to this embodiment configured as described above, since the temperature sensor 65 is in direct contact with the battery cell 1, more precise temperature measurement may be performed. In addition, since the size of the auxiliary pressing unit 30 may be significantly reduced, manufacturing costs may be reduced.

As set forth above, according to an embodiment, even when a through-hole is formed in the pressurizing unit, the battery cell may be uniformly pressurized. Therefore, the occurrence of errors in measurement due to deviations in the pressure applied to the battery cell may be significantly reduced.

While embodiments have been shown and described above, it will be apparent to those skilled in the art that modifications and variations could be made without departing from the scope of the present disclosure as defined by the appended claims.

What is claimed is:

1. An apparatus of testing an all-solid state secondary battery by nail penetration, the apparatus comprising:
    a pressurizing unit pressurizing a battery cell;
    a penetrating member inserted into a through-hole provided in the pressurizing unit to pass through the battery cell; and
    an auxiliary pressing unit disposed between the pressurizing unit and the battery cell and transferring pressure applied by the pressurizing unit to the battery cell,
    wherein the auxiliary pressing unit is disposed between the through-hole and the battery cell in a form to block the through-hole,
    wherein the auxiliary pressing unit is configured to be penetrated or broken by the penetrating member when the penetrating member penetrates the battery cell.

2. The apparatus of claim 1, wherein the auxiliary pressing unit is disposed to face an entirety of one surface of the battery cell.

3. The apparatus of claim 1, wherein the auxiliary pressing unit is formed of an insulating resin material.

4. The apparatus of claim 1, wherein the auxiliary pressing unit is formed of a thermoplastic resin or a thermosetting resin.

5. The apparatus of claim 1, wherein the pressurizing unit includes,
    a first pressing portion disposed on the battery cell and pressing the battery cell while descending; and
    a second pressing portion disposed below the battery cell and supporting the battery cell.

6. The apparatus of claim 5, further comprising a fastening member coupled to the first pressing portion and the second pressing portion to adjust a separation distance between the first pressing portion and the second pressing portion.

7. The apparatus of claim 1, wherein the pressurizing unit is provided with at least one temperature sensor disposed on a pressing surface in contact with the auxiliary pressing unit.

8. The apparatus of claim 7, further comprising a temperature measurement unit connected to the temperature sensor to measure a temperature of the battery cell.

9. The apparatus of claim 1, wherein the pressurizing unit is provided with at least one pressure sensor disposed on a pressing surface in contact with the auxiliary pressing unit.

10. The apparatus of claim 9, further comprising a voltage measurement unit connected to an electrode lead of the battery cell to measure a voltage change of the battery cell.

11. The apparatus of claim 9, further comprising a controller obtaining voltage change information and temperature change information of the battery cell and outputting the information to a display.

12. An apparatus of testing an all-solid state secondary battery by nail penetration, the apparatus comprising:
    a pressurizing unit pressurizing a battery cell;
    a penetrating member inserted into a through-hole provided in the pressurizing unit to pass through the battery cell; and
    an auxiliary pressing unit disposed between the pressurizing unit and the battery cell and transferring pressure applied by the pressurizing unit to the battery cell,
    wherein the auxiliary pressing unit is disposed between the through-bole and the battery cell in a form to block the through-hole,
    wherein the auxiliary pressing unit is inserted and disposed in the through-hole.

13. The apparatus of claim 12, wherein the through-hole of the pressurizing unit is provided with an expansion groove in which the auxiliary pressing unit is disposed.

14. The apparatus of claim 12, wherein a pressing surface of the pressurizing unit and a pressing surface of the auxiliary pressing unit are disposed on the same plane.

* * * * *